US008527936B2

(12) United States Patent
Jain et al.

(10) Patent No.: US 8,527,936 B2
(45) Date of Patent: Sep. 3, 2013

(54) METHOD AND SYSTEM FOR IMPLEMENTING GRAPHICAL ANALYSIS OF HIERARCHICAL COVERAGE INFORMATION USING TREEMAPS

(75) Inventors: Anuja Jain, New Delhi (IN); Sandeep Pagey, Noida (IN); Yaron Peri-Glass, Raanana (IL)

(73) Assignee: Cadence Design Systems, Inc., San Jose, CA (US)

( * ) Notice: Subject to any disclaimer, the term of this patent is extended or adjusted under 35 U.S.C. 154(b) by 409 days.

(21) Appl. No.: 12/347,681

(22) Filed: Dec. 31, 2008

(65) Prior Publication Data

US 2010/0169853 A1 Jul. 1, 2010

(51) Int. Cl.
*G06F 15/04* (2006.01)
*G06F 17/50* (2006.01)

(52) U.S. Cl.
USPC .......... 716/139; 716/110; 716/111; 716/103; 716/136

(58) Field of Classification Search
USPC ....................... 716/5, 50, 111, 139
See application file for complete search history.

(56) References Cited

U.S. PATENT DOCUMENTS

| | | | |
|---|---|---|---|
| 6,182,258 | B1 | 1/2001 | Hollander |
| 6,470,489 | B1 * | 10/2002 | Chang et al. .................. 716/52 |
| 2004/0168115 | A1 * | 8/2004 | Bauernschmidt et al. .... 715/500 |
| 2005/0268269 | A1 * | 12/2005 | Coiley .......................... 716/11 |
| 2008/0021691 | A1 * | 1/2008 | Roesner et al. ................ 703/14 |
| 2009/0018996 | A1 * | 1/2009 | Hunt et al. ....................... 707/2 |
| 2009/0125825 | A1 * | 5/2009 | Rye et al. ..................... 715/764 |

OTHER PUBLICATIONS

Johnson, B., et al., Treemaps: a spacefilling approach to the visualization of hierarchical information structure. In Proceedings of the second International IEEE Visualization Conference, pp. 284-291, Oct. 1991.
Shneiderman, B., Tree visualization with tree-maps: A 2-d space-filling approach, in ACM Transactions on Graphics, 11(1):92-99, Jan. 1992.
Bruls, M., et al., Squarified treemaps. In W. de Leeuw and R. van Liere, editors, Proceedings of Joint Eurographics and IEEE TCVG Symposium on Visualization, pp. 33-42. Springer, Vienna, 2000.
Shneiderman, B., et al., "Ordered Treemap Layouts", infovis, p. 73, IEEE Symposium on Information Visualization 2001 (INFOVIS'01), 2001.
Engdahl, B., "Ordered and Unordered Treemap Algorithms and Their Applications on Handlheld Devices", p. 30, Master's Degree Project, Stockholm, Sweden 2005.
"IEEE Standard for the Functional Verification Language E," IEEE Std 1647-2008 , vol., no., pp. c1-c464, Aug. 3 2008 doi: 10.1109/Ieeestd.2008.4586409, URL: http://ieeexplore.ieee.org/stamplstamp.jsp?tp=&arnumber=4586409&isnumber=4586408.

\* cited by examiner

*Primary Examiner* — Thuan Do
*Assistant Examiner* — Brian Ngo
(74) *Attorney, Agent, or Firm* — Vista IP Law Group, LLP

(57) ABSTRACT

An improved method, system, user interface, and computer program product is disclosed for performing graphical analysis of coverage. According to some approaches, a graphical user interface uses treemaps to provide analysis of verification coverage. This allows the user to efficiently obtain the overall and/or complete picture of the coverage space, as well as the relative size of nodes in terms of number of coverage elements contained in them. Moreover, the present treemap approach provides relative comparison of coverage of the nodes and allows the user to identify whether there is any missing coverage, and if so, whether the missing coverage evenly balanced. This information is very useful for the decision made by the user regarding overall coverage and steps to be taken to improve the coverage.

45 Claims, 12 Drawing Sheets

METHOD AND SYSTEM FOR IMPLEMENTING GRAPHICAL ANALYSIS OF HIERARCHICAL COVERAGE INFORMATION USING TREEMAPS

BACKGROUND

The invention relates to technology for verifying designs and for analysis of coverage information for verifying designs.

Many phases of modern design activities are performed with computer aided design (CAD) tools or electronic design automation (EDA) systems. For example, for the process of creating an electronic design (e.g., of an integrated circuit or "IC"), a designer first creates high level behavior descriptions of the IC device using a high-level hardware design language (HDL). Common examples of HDLs include Verilog and VHDL. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, along with their sizes and interconnections. An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. CAD or EDA tools may also be used to generate software designs, system level designs, or mixed hardware-software designs.

Modern designs are often very large and complex. For example, a modern circuit design may have many millions of transistors and a modern software design may have many millions of lines of code. As designs become more complex, the likelihood of design errors increases. Therefore, it is very likely that design tools are also needed to manage the complexity of the design, particularly to verify that the design will work for its intended purpose. For example, with the increasing complexity of digital designs, functional verification is beginning to occupy a significant portion of the overall design cycle and effort of the design process for an integrated circuit design.

Design verification is the process of determining whether a design, such as an integrated circuit, board, software, or system-level architecture, adequately implements the requirements defined by the specification of the architecture for that design. Design verification for a design or device under testing (DUT) may be performed on the actual device/software or on a simulation model of the device/software. However, design verification is becoming more difficult and time consuming as the underlying designs themselves are becoming larger and more complex, and the simulation models of the design are also becoming more complex to prepare and to test. For the purposes of explanation only and without intending to be limiting in any way, the following discussion centers upon verification/testing activities which are performed on simulation models of the device. As used herein and without intent of limitation, the terms "testing" and "verification" are used interchangeably.

To verify a design, the simulated model of the design can receive input stimuli in the form of test vectors (e.g., as a string of binary digits applied to the input of a circuit). The simulated model then produces results, which are checked against the expected results for the particular design of the device. For example, the test generator disclosed in U.S. Pat. No. 6,182,258 can be used to generate tests to interact with a design. The test generation procedure is written in a verification specific object-oriented programming language and is used to write various tests which automatically create a device verification test by a test generator module. A mix of directed, random and constrained-random techniques can be employed to perform simulation-based functional verification.

However, it is important that there is adequate "coverage" of the portions of the design that needs to be tested. Coverage is a function of the ability to fully explore the reachable state space of the design, in order to examine possible functions and outcomes of any particular input or set of inputs to the DUT. With modern designs becoming extremely large, it is becoming more and more difficult to confirm adequate coverage of the tests. For purposes of illustration, and not by way of limitation, the examples in this document explicitly address the hardware verification domain, but the concepts described herein are applicable as well to software verification or any other domain which employs coverage analysis.

Coverage analysis is the process of analyzing the coverage of a given test or set of test activities, and is often applied to multiple verification domains, for example to software verification or hardware verification. Verification coverage can be broadly divided into code coverage and functional coverage. Code coverage is derived from the code (e.g., HDL code) for the design being verified. Functional coverage is specified explicitly by means of a number of functional verification constructs, e.g., using assertion language constructs such as Accellera PSL (property specification language) and SVA (System Verilog Assertions) cover constructs, SystemVerilog/e covergroups, and/or transactions. Code coverage may also includes FSM (finite state machine) coverage, which helps interpret the synthesis semantics of the HDL design and monitors the coverage of the FSM representation of control logic in the design.

Analyzing the coverage to identify areas of improvement is an important step of coverage driven verification after coverage data has been collected from simulation-based verification runs. The analysis is followed by additional actions to improve the coverage of the test. In many cases, the coverage analysis is performed on hierarchical structures, where the hierarchy used for the analysis is the design hierarchy itself. This correspondence between the hierarchy and the test coverage allows the user to relate the coverage to the design objects. For plan-based verification methodologies, the user performs analysis using the hierarchy of a verification plan, which is a structured document containing a hierarchy of sections. The hierarchical structure may be a design hierarchy, in which the basic element or node of the hierarchy is a design instance. The design hierarchy may also be a user-defined section hierarchy for a verification plan, in which the basic element or node of this hierarchy is a section.

A graphical coverage analysis tool provides multiple features to analyze the coverage data in hierarchical structures. The graphical presentation of hierarchical coverage information should allow quick browsing of hierarchies along with fast identification of hierarchical nodes which contribute low coverage. The primary motive is to find an efficient representation of hierarchical structure to perform the coverage analysis, where reaching coverage of 100% in all basic elements of a hierarchy implies 100% verification completion. Therefore, from a practical point of view, the goal is to reach 100% cumulative-coverage for the top level root of the hierarchy. This means that all sub elements have 100% self-coverage as well. However, achieving the figure of 100% is not easy, and requires deep understanding of the missing coverage, followed by some directed steps to enhance it.

FIG. 1 shows a conventional approach for implementing a user interface for analyzing verification coverage information in a hierarchy. The approach of FIG. 1 includes a tree browser 102 that displays the hierarchy in a node-and-list representation. When used for coverage analysis, this node-and-list representation shows the coverage for each node in the list. The user can scroll through the hierarchical tree, and expand or contract the sub-node details, to analyze its coverage. The details pane 106 displays the complete details for each selected node in the tree browser representation of the hierarchy. The sub-elements table 104 shows the complete list of sub-elements of a tree underneath a node. This type of interface provides information about the coverage details for a specific node, as well as the location and details of elements in the sub-elements table.

A significant problem with this approach, however, is that display of a large list of elements in the hierarchy browser 102 can overwhelm the available display space. In other words, a large list of nodes will be too large to allow all of the nodes to fit on the screen at the same time, which means that the user must scroll up and down or page forward and backward through the screen to view the node details. In addition, to maximize the fit of the list onto the screen, some or all of the sub-nodes must be collapsed and therefore not directly displayed to the user. These deficiencies can severely affect the user's ability to meaningfully review and analyze the hierarchy, and negatively affect the user's ability to grasp the entire picture of the hierarchical structure. Additionally, this approach is inefficient since it requires the user to scroll through the complete list of nodes and individually look at their coverage in-order to make a decision as to which nodes are contributing to low overall cumulative-coverage of the design. As the levels of hierarchy and number of nodes increase, the space occupied by the tree representation increases proportionately.

SUMMARY

Embodiments of the present invention provide an improved method, system, user interface, and computer program product for performing graphical analysis of coverage. According to some embodiments of the invention, a graphical user interface uses treemaps to provide analysis of verification coverage. This allows the user to efficiently obtain the overall and/or complete picture of the coverage space, as well as the relative size of nodes in terms of number of coverage elements contained in them. Moreover, the presented treemap approach provides relative comparison of coverage of the nodes and allows the user to identify whether there is any missing coverage, and if so, whether the missing coverage evenly balanced, e.g., whether there are few "big" holes and many "small" ones. This information is very useful for the decision made by the user regarding overall coverage and steps to be taken to improve the coverage.

Other additional objects, features, and advantages of the invention are described in the detailed description, figures, and claims.

DETAILED DESCRIPTION

Embodiments of the present invention provide a method, system, user interface, and computer program product for performing graphical analysis of coverage information. According to some embodiments of the invention, a graphical user interface uses treemaps to provide analysis of verification coverage, where a hierarchy of nodes is graphically displayed using treemaps.

A treemap partitions a display area into a collection of display portions, where the graphical configuration of each display portion corresponds to the content of the node that is associated with that treemap portion. For example, the size of each display portion of the treemap can be configured to be proportional to a given property of that node and is sized relative to that same property for the treemap portions for other nodes. The color or shading of the rectangular treemap portion can also be configured to represent one or more properties of the nodes that correspond to that treemap portion.

Treemaps are a representation designed for the convenient human visualization of large tree structures. The human vision is gifted with the ability to recognize spatial arrangement of various elements in a picture and identify their relationships. The treemap visualization method presents hierarchical information on a 2-D display space, such that the 100% allocated space is consumed. This makes it convenient for human to gather the complete information in one set of visual graphics.

Figure 2:
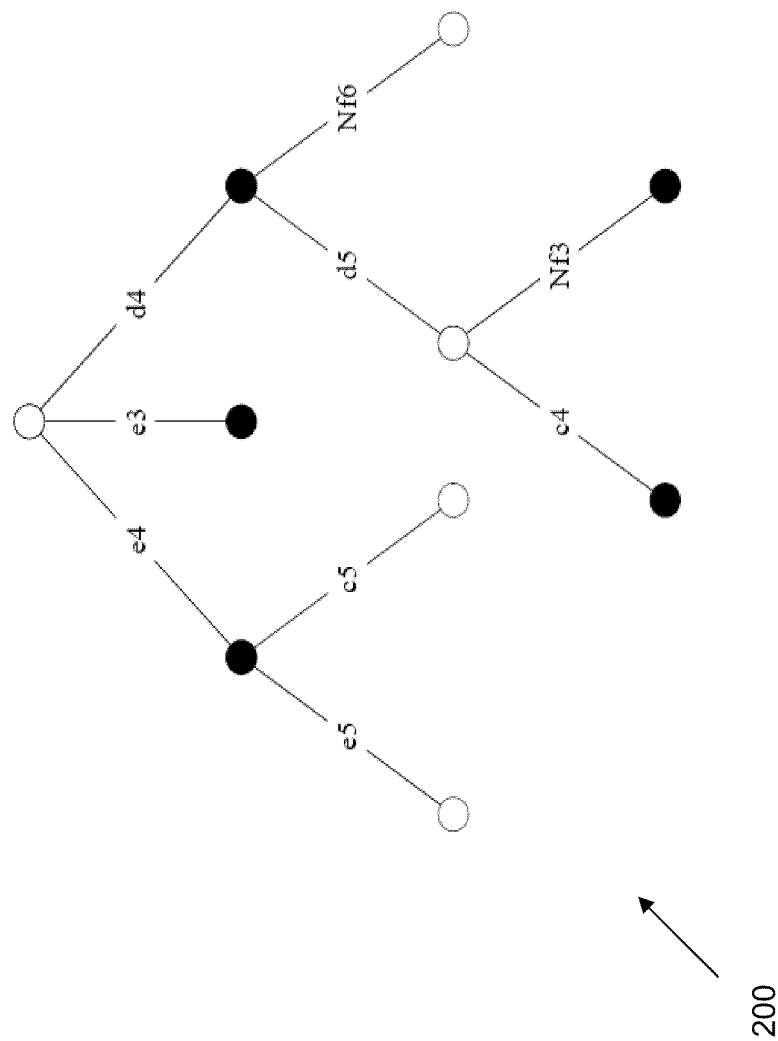
FIG. 2 illustrates an example hierarchy.
Figure 3:
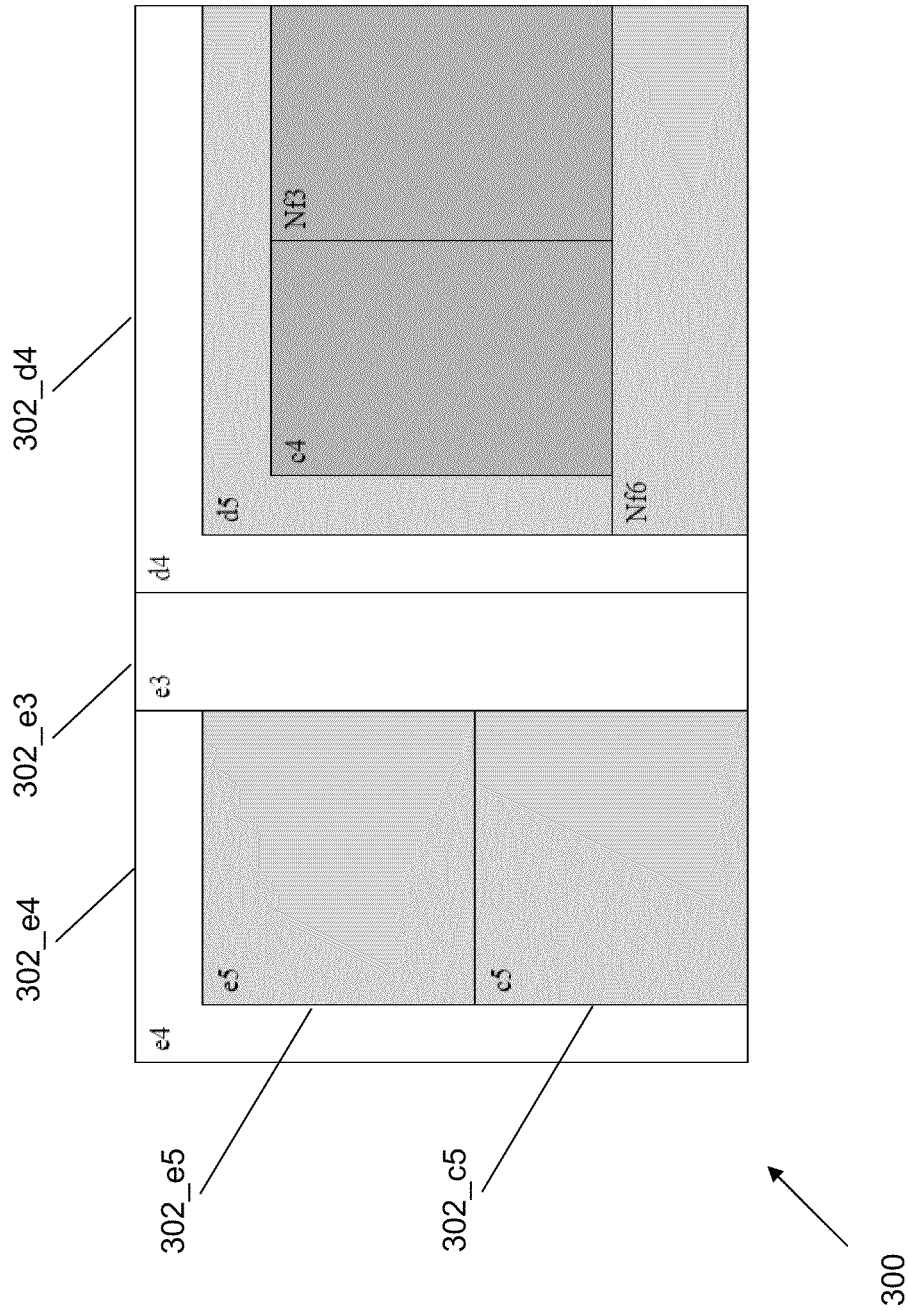
FIG. 3 illustrates a treemap constructed from the hierarchy of FIG. 2.

FIG. 2 shows an example of a traditional node and link representation of a tree 200 of hierarchical elements. FIG. 3 shows the equivalent information of the tree 200 of FIG. 2 as a treemap 300, where each rectangular display portion 302 corresponds to a node on tree 200. Each sub-node in the tree 200 is displayed as a sub-area of a rectangular display portion 302. For example, the highest level nodes in tree 200 are nodes e4, e3, and d4. These nodes are presented as the highest level rectangular display portions 302_e4, 302_e3, and 302_d4. Each sub-node may be presented as a sub-display portion within another display portion. For example, node e4 corresponds to sub-nodes e5 and c5 in tree 200 of FIG. 2. These sub-nodes are displayed as sub-display portion 302_e5 and 302_c5 in the treemap 300 of FIG. 3.

The size of each rectangular display portion indicates the relative size of the node associated with the display portion. Here, the size of display portion 302_e4 is larger than the size of display portion 302_e3, indicating that the relative measure of some property of node e4 is larger than the relative measure of that same property for node e3.

In the traditional tree representation of FIG. 2, as the levels of hierarchy and number of nodes increase, the space occupied by the tree representation 200 also increases proportionately. Once the tree 200 becomes large enough, the entire tree cannot fit onto a single meaningful display. However, in the approach of FIG. 3, the overall space occupied by the treemap 300 does not increase, as additional nodes are simply represented as additional nested rectangles. Therefore, the treemap allows humans to easily visualize hierarchical tree structures on a 2-D space, where the treemap representation is designed for the convenient human visualization of large tree structures.

Figure 4:
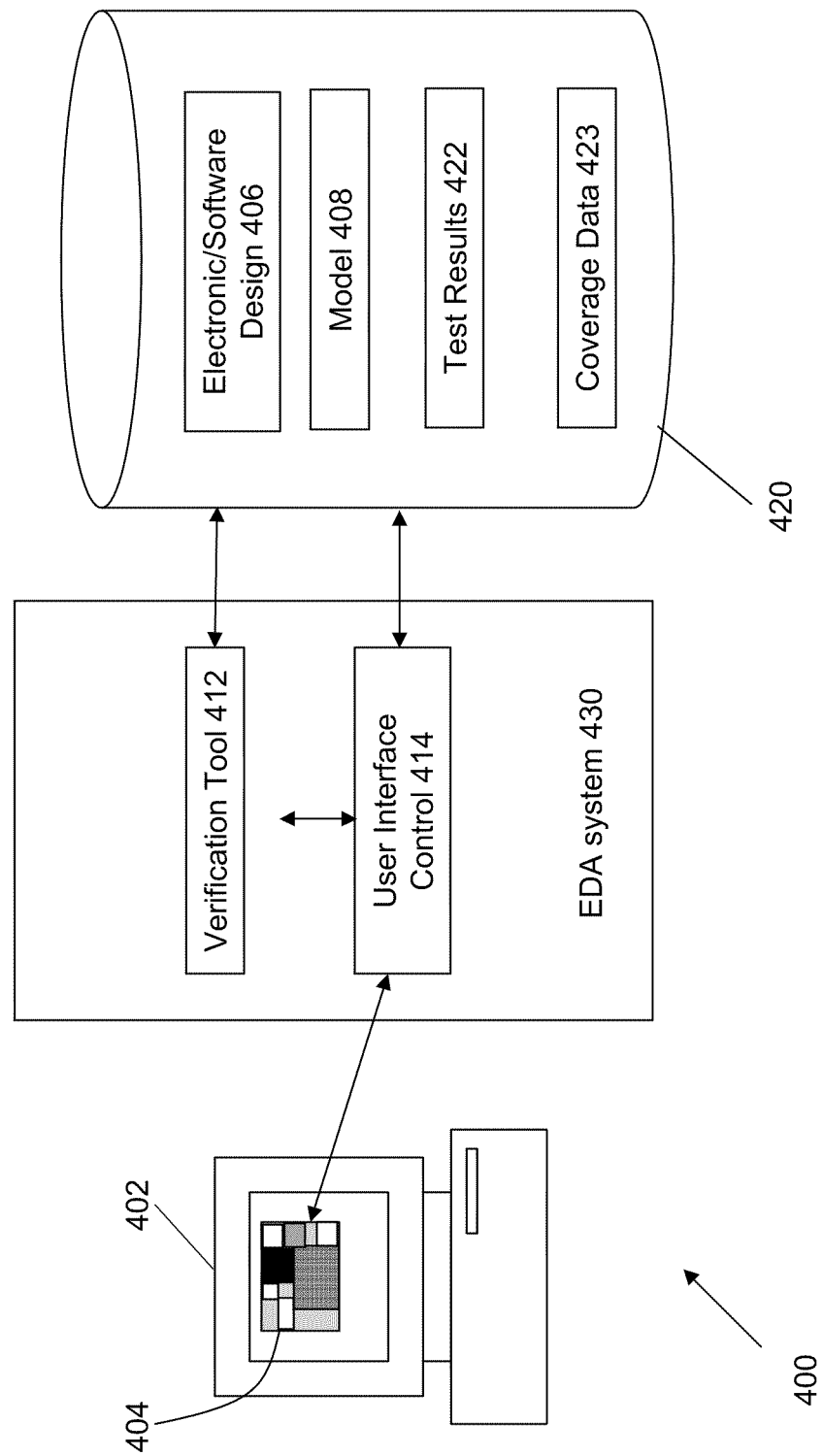
FIG. 4 illustrates a system for graphically analyzing coverage according to some embodiments of the invention.

FIG. 4 shows an architecture of a system 400 for performing coverage analysis according to one embodiment of the invention. The system 400 includes an EDA tool 430 that is operated by one or more users at user station 402 for performing verification activities. The users at user station 402 correspond to any individual, organization, or other entity that uses system 400 for designing or verifying a design. The user stations 402 can be implemented using any suitable computing platform.

The user station 402 may be associated with one or more databases 420 or other computer readable medium that holds data regarding an electronic/software design 406. The electronic/software design 406 comprises any set of information or parameters that the user has developed to determine the requirements or design details corresponding to the electronic/software design 406.

A verification tool 412 interacts with a model 408 of the electronic/software design 406 to provide test stimulus to test and verify the electronic/software design 406. According to the present embodiment, verification tool 412 is a computer aided design (CAD) tool or electronic design automation (EDA) tool that has the capability to utilize a verification environment for testing a design having hardware, software, or a combination of both hardware and software. The verification environment is used to create activity that is similar to the way the overall system is expected to behave, thereby providing stimulus to actively and thoroughly test the design. The test verification environment may be implemented using test software in a language specific to the test system. Test results 422 may be stored in the database 420, as well as coverage data 423, e.g., based upon performing coverage analysis for the tests used to create the test results 422.

The user station 402 is implemented to include a graphical user interface 404. The graphical user interface 404 can be used to graphically display a treemap representation of the hierarchy of nodes for the coverage groups used for the verification activities. The EDA tool 430 includes a user interface control 414 that receives data based upon manipulation of the user interface 404 by the user at user station 402, and which is used to update the display of coverage information for the electronic/software design 406 at interface 404.

The treemaps of interface 404 allow for graphical analysis of coverage of hierarchical structures by showing a complete hierarchy in a single treemap, and/or by showing the hierarchy at one particular level at a time in a single treemap. As explained in more detail below, these approaches serve different use models and a verification application can choose to implement any one or both.

The treemap approach to implementing a user interface allows the user to efficiently obtain the overall and/or complete picture of the verification coverage space, as well as the relative size of nodes in terms of number of coverage elements contained in them. Moreover, the present treemap approach provides relative comparison of coverage of the nodes and allows the user to identify whether there is any missing coverage, and if so, whether the missing coverage is evenly balanced, e.g., whether there are few "big" holes and many "small" ones. This information is very useful for the decision made by the user regarding overall coverage and steps to be taken to improve the coverage.

Figure 5:
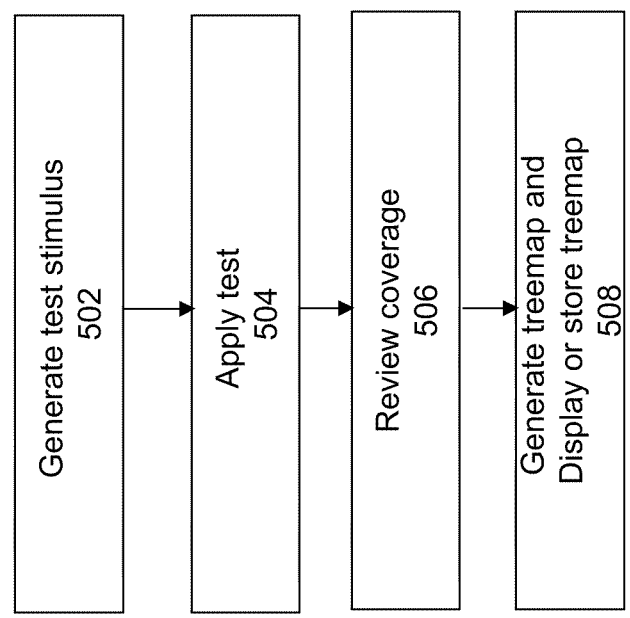
FIG. 5 illustrates a flowchart of a process or graphically analyzing coverage according to some embodiments of the invention.

FIG. 5 illustrates a flowchart of a process for implementing treemaps according to some embodiments of the invention. At 502, test stimulus is generated to test a design. A mix of directed, random and constrained-random techniques can be employed to perform simulation-based functional verification. The test generator disclosed in U.S. Pat. No. 6,182,258 is an example of an approach that can be used to generate tests to interact with a design. U.S. Pat. No. 6,182,258 is hereby incorporated by reference in its entirety.

The test generation procedure is written in a verification specific programming language and is used to write various tests which automatically create a device verification test by a test generator module. A suitable verification programming language is the "e" programming language, which is a general purpose testbench language that can be used for either hardware or software. The "e" programming language is an IEEE standard verification language (1647-2008), with further information about this language available from the IEEE website at the website: standards.ieee.org/announcements/IEEE1647_eLanguageStandard.html.

At 504, the test stimuli are applied to the simulation model of the design. According to some embodiments, a verification tool is used to apply the test stimuli and to collect the verification test results. At 506, the test stimuli are checked to determine the coverage of nodes within the context of the hierarchy of the coverage plan and design.

At 508, the hierarchy of verification coverage data is converted to one or more treemaps and displayed to the user in a user interface. Various treemap layout schemes may be employed within the scope of embodiments of the invention. For example, slice and dice treemaps, cushion treemaps, and squarified treemaps may be employed within embodiments of the invention.

The slice and dice treemap is a layout scheme in which the whole hierarchical tree is represented as a rectangle. Each sub-tree is represented as a sub-rectangle of its parent rectangle. At each level of hierarchy the rectangles are split vertically or horizontally. Each splitting is done so that the area covered by a rectangle is proportional to the number of nodes it contains.

Figure 6:
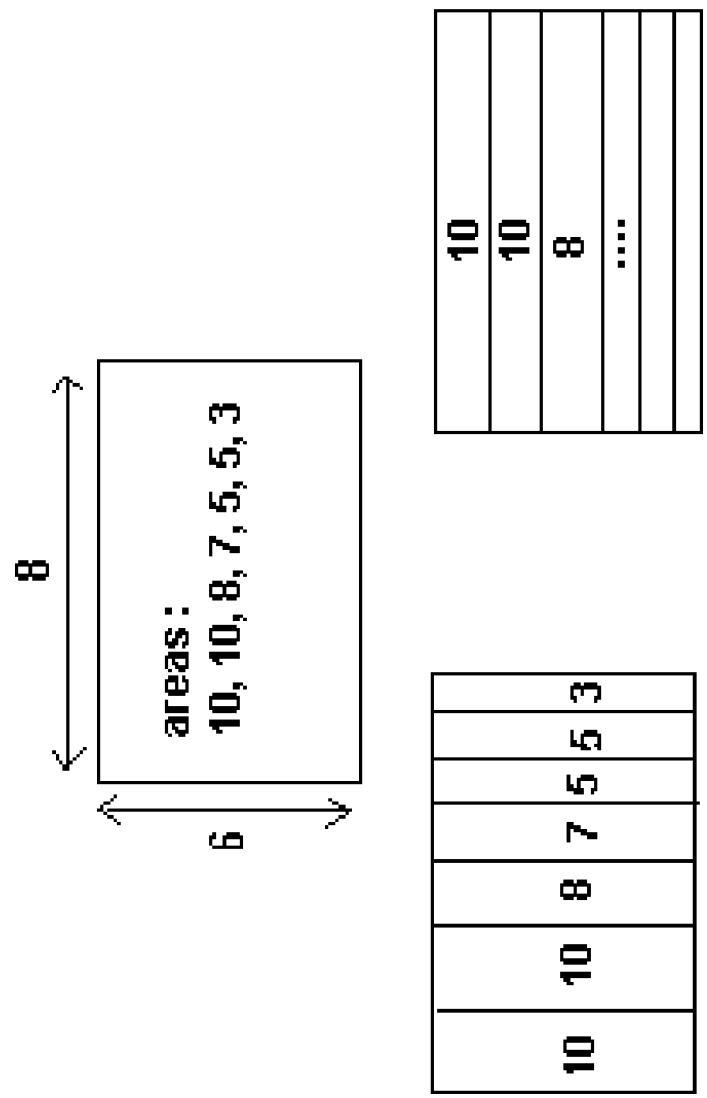
FIG. 6 illustrates a slice and dice approach for implementing a treemap.

FIG. 6 illustrates the slice and dice approach to treemaps. Consider a rectangle with width 8 and height 6, and furthermore suppose that this rectangle must be subdivided in seven rectangles with areas 10, 10, 8, 7, 5, 5 and 3. One possible approach to implement the slice & dice treemap is to subdivide the rectangle either horizontally or vertically, where the aspect ratio of a rectangle is defined as the max (width/height, height/width). In this example, the thinnest rectangles have aspect ratios of 12 and 21, for horizontal and vertical subdivisions respectively, as shown in FIG. 6. Even if the partitioning was done both vertically and horizontally alternatively there would not have been significant improvement in the aspect ratio.

The potential disadvantage of slice and dice treemaps is that these treemaps may generally result in extra thin elongated rectangles, which could be difficult to analyze under certain circumstances.

A squarified treemap presents all nodes and leaves as square-like rectangles and have advantages of using display space efficiently, avoiding cluttering of thin rectangles and easing the comparison of size of rectangles as their aspect ratios are similar, e.g., where the aspect ratio (max (height=width; width=height)) approaches 1 as close as possible. This treemap representation is visually appealing in part because the rectangles are more square-like. In many cases, it is easier for human eye to identify relationships in a symmetrical shape as compared to dissymmetrical ones. If there is a square of same area as a rectangle, then it is relatively easier for human to extract information out of a square, as compared to the rectangle.

Figure 7:
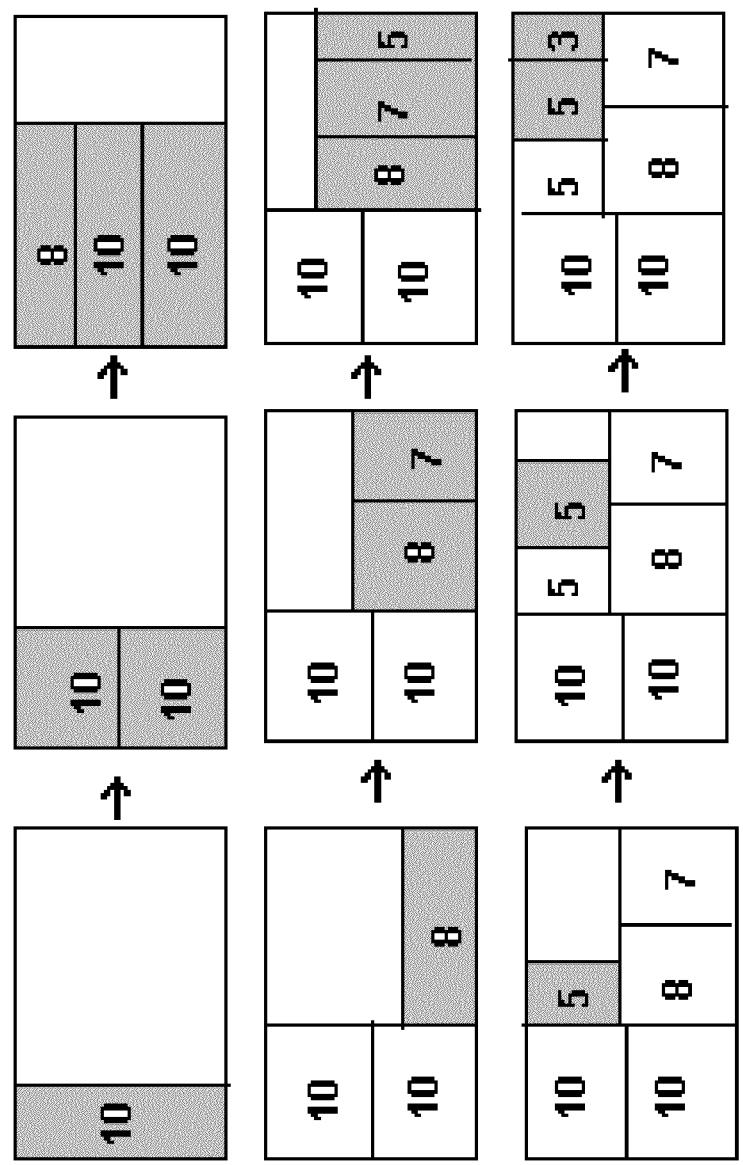
FIG. 7 illustrates a squarification approach for implementing a treemap.

To illustrate the squarified treemap, consider again the 8×6 rectangle of FIG. 6, but now tessellating the rectangle into squarified rectangles. FIG. 7 illustrates this approach of generating a squarified treemap, such that the aspect ratio of each rectangle approaches 1 as much as possible. The first step is to bifurcate the initial rectangle. Since the original rectangle is longer along its width than its height, this rectangle is divided horizontally. This single rectangle is then added as shown in the figure, where the aspect ratio of this first rectangle is 18/5. In the next step, the second rectangle of same area (10) is added above the first. The aspect ratios improve to 10/9. However, the next rectangle (area 8) is added above these original rectangles, the aspect ratio of this rectangle becomes as sub-optimal as 49/18. As a result, it is decided that there is an optimum for the left part of the rectangle in step two. Next, work begins on the right-hand part. The rectangles are now vertically subdivided, because the rectangle is higher than wide. Next, the rectangle with area 8 is added, followed by the rectangle with area 7. The aspect ratio now decreases. Addition of the next (area 5) however does not improve the result, so the result of the previous step is accepted, and work starts to fill the right top partition.

These steps are repeated until all rectangles have been processed. The aspect ratio achieved eventually comes out to approximately 507/196. Other results can also be obtained to achieve different aspect ratios, since the order in which the rectangles are processed is important to the final result. In some embodiments, a decreasing order of size may be addressed to provide better results, where large rectangles are filled at the beginning followed by smaller sub-rectangles.

In a cushion treemap, shading is implemented as an extra cue to emphasize tree-structures. The human visual system is trained to interpret variations in shade as illuminated surfaces. As a result, once can judge and understand a tree structure better with the help of shading on the surface, since it imparts a 3D appearance to the object. A cushion treemaps can use slice & dice, squarified or any other lay-out schemes, with the differentiator being the extra shading done in these treemaps.

Figure 11:
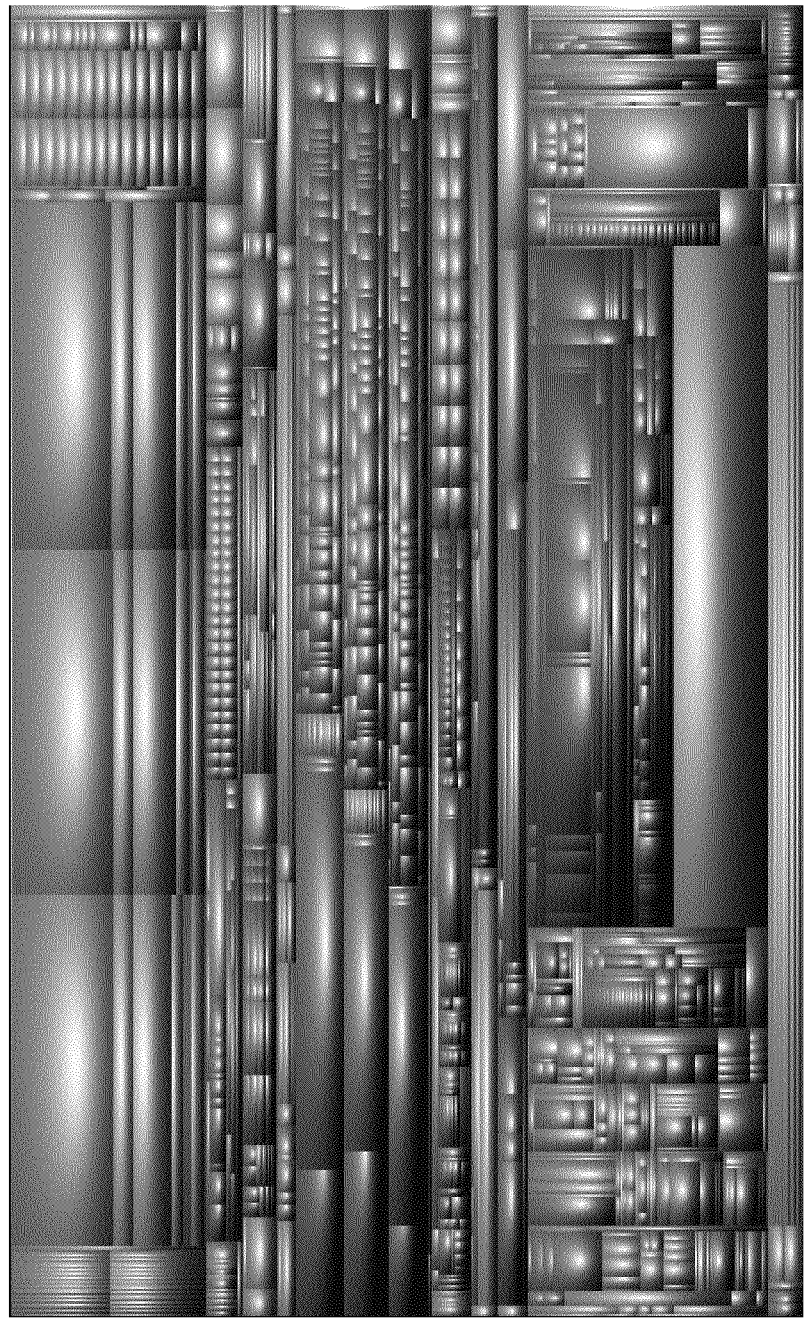
FIG. 11 illustrates a cushion treemap.

Cushion treemaps can be generated by performing binary subdivision. To begin, consider there to be a straight line which is divided in half, and for which a bump (e.g., a parabolic curve) is added to each of the two segments of the line. In the next step, the two bumps are subdivided further into halves and then a bump is drawn on each of those segments. This will result in four such bumps on top of two lower bumps. Now, consider these bumps as the side view of a bent strip, where a top view of these parabolas is then taken where the bumps transform into sequence of ridges. Where there is a large number of overlapping of curves, this would result in a dark shade when viewed from top. Alternatively, where curve lines do not intersect, then this gives rise to lighter shades. This 2-D example can also be applied to the 3-D domain. Suppose that the x-axis is horizontal, the y-axis is vertical, and that the z-axis points towards the viewer. One can subdivide the rectangle in the x-direction, then add ridges aligned with the y-direction, and vice versa for subdivision in the y-direction. As a result, cushions are generated: The summation of orthogonal ridges gives a cushion-like shape, e.g., as shown in FIG. 11. The parameter used to draw cushion treemaps is the Intensity, where the intensity I is given by the following equation:

$$I = I_a + I_s \max(0, (n.l)/|n||l|)$$

Where $I_a$=Intensity of ambient light, $I_s$=Intensity of directorial light source, l=vector that points towards light source, and n=normal driven by x, y, z co-ordinates.

According to some embodiments of the invention, verification coverage is analyzed using squarified rectangular-shaped treemaps. The presentation of nodes and leaves as more square-like rectangles (Squarified Treemaps) has several advantages, including the advantage of displaying space more efficiently. For example, the number of pixels to be used for the border of the treemaps is proportional to its circumference, whereas for rectangles, this number is minimized if a more square-like structure is used. In addition, square-like items are easier to detect and point at, whereas thin rectangles may clutter up and give rise to aliasing errors (e.g., aliasing errors may be observed when the rectangles are created that fall between the pixels). Moreover, comparison of the size of rectangles is easier when their aspect ratios are similar as when squarified treemaps are employed.

As previously noted, squarified tree-maps can be created by tessellating a rectangle recursively into rectangles, such that their aspect-ratios (e.g. max(height=width; width=height)) approach 1 as close as possible. The goal is to produce square-like rectangles for a set of siblings, given the rectangle where they have to fit in. The same approach is applied recursively, resulting in nesting of rectangles. The starting point for a next level will then be a square-like rectangle, which provides an opportunity for a good subdivision. The algorithm employed for the layout of the children in one rectangle is a recursive procedure squarify, as set forth below:

```
procedure squarify(list of real children, list of real row, real w)
begin
    real c = head(children);
    if worst(row, w) _ worst(row++[c], w) then
        squarify(tail(children), row++[c], w)
    else
        layoutrow(row);
        squarify(children, [ ], width( ));
    fi
end
```

This function assumes a rectangle datatype that contains the layout during the computation and is global to the squarify procedure. This supports a width function that provides the length of the shortest side of the remaining sub-rectangle in which the current row is placed and a function that adds a new row of children to the rectangle. In this procedure, the "++" notation refers to the concatenation of lists, "[x]" is the list containing element x, and "[ ]" is the empty list. The input of this procedure is a list of real numbers, representing the areas of the children to be laid out. The row list contains the rectangles that are currently being laid out. The function worst( )returns the highest aspect ratio of a list of rectangles, given the length of the side along which they are to be laid out.

Figure 1:
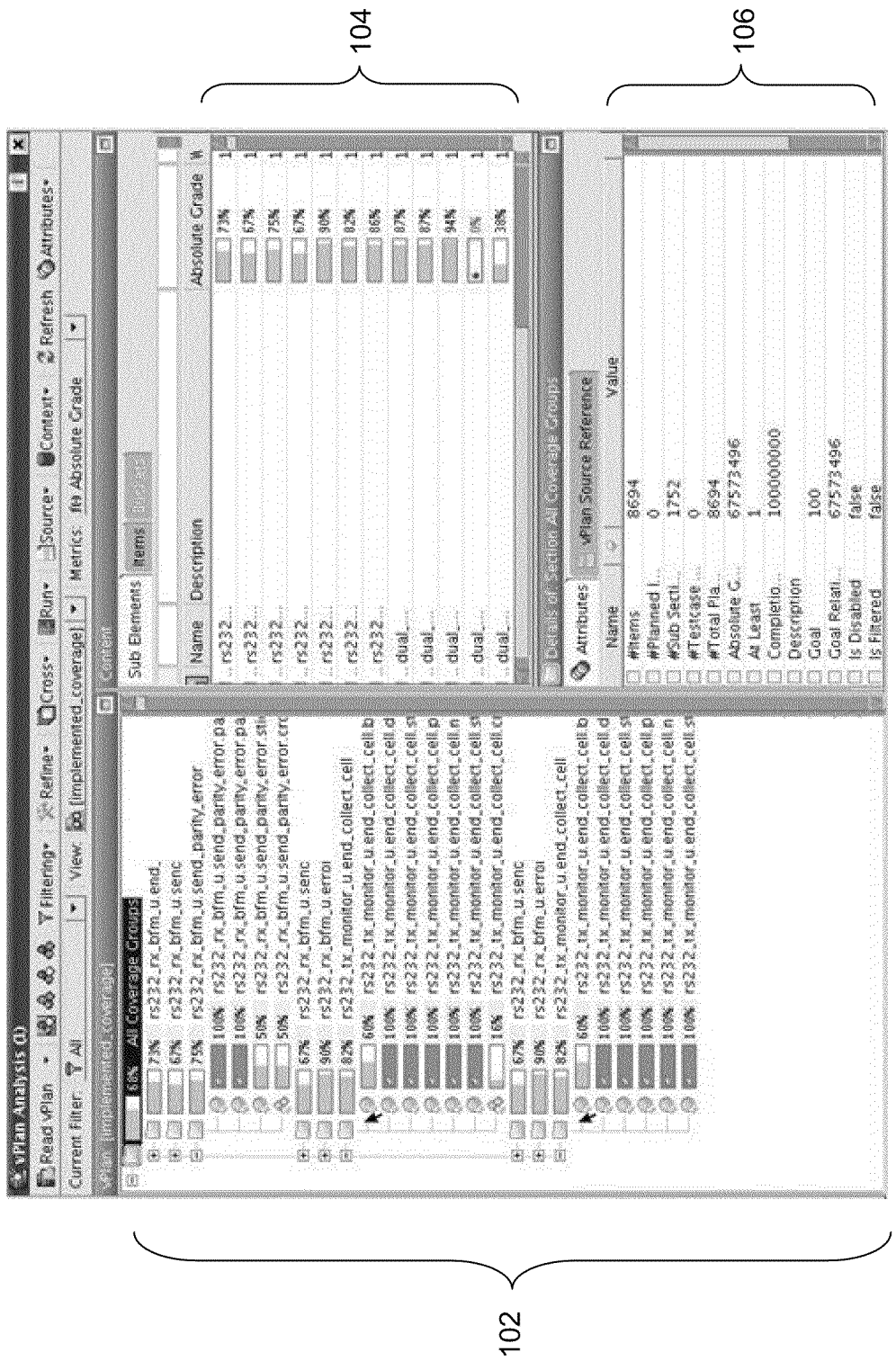
FIG. 1 depicts a conventional hierarchical browser.

As noted with respect to FIG. 1, the node and list approach to presenting coverage is disadvantageous because the user has to scroll through the complete list and individually look at their coverage percentage numbers in-order to make a decision as to which design unit(s) are contributing to low cumulative coverage of his design. Using tree-maps for the hierarchical representation addresses this problem because that design unit which contributes to low coverage percentage of the design, will stand-out clearly in the hierarchy.

At a level of the hierarchy, a design unit may have two parameters: (i) self-coverage and (ii) cumulative coverage.

Self coverage refers to the number of "covered" items such as blocks in a current instance or module divided by the total number of items in that instance or module. Cumulative coverage refers to the number of covered items (e.g., blocks, expressions, states, and arcs) found in the instance/module plus all of its descendents divided by the total number of items found in the instance/module plus all of its descendents.

These two parameters can be pictorially represented using treemaps through a rectangle partitioned into two sub-rectangles horizontally with a dark line. The upper rectangle shows self-coverage and lower one represents cumulative-coverage as described further with respect to FIGS. 9 and 10. The self-coverage rectangle is further divided depending on types of coverage enabled for the design, e.g., three sub-rectangles are drawn if all coverage types (Code/Functional/FSM Coverage) are enabled. The size/color of each sub-rectangle is driven by the factors outlined below. The cumulative-coverage rectangle acts as the root design-unit. This root rectangle is further divided into n sub-rectangles where n is the number of child instances of the given design unit at the immediate next lower level of hierarchy.

Figure 8:
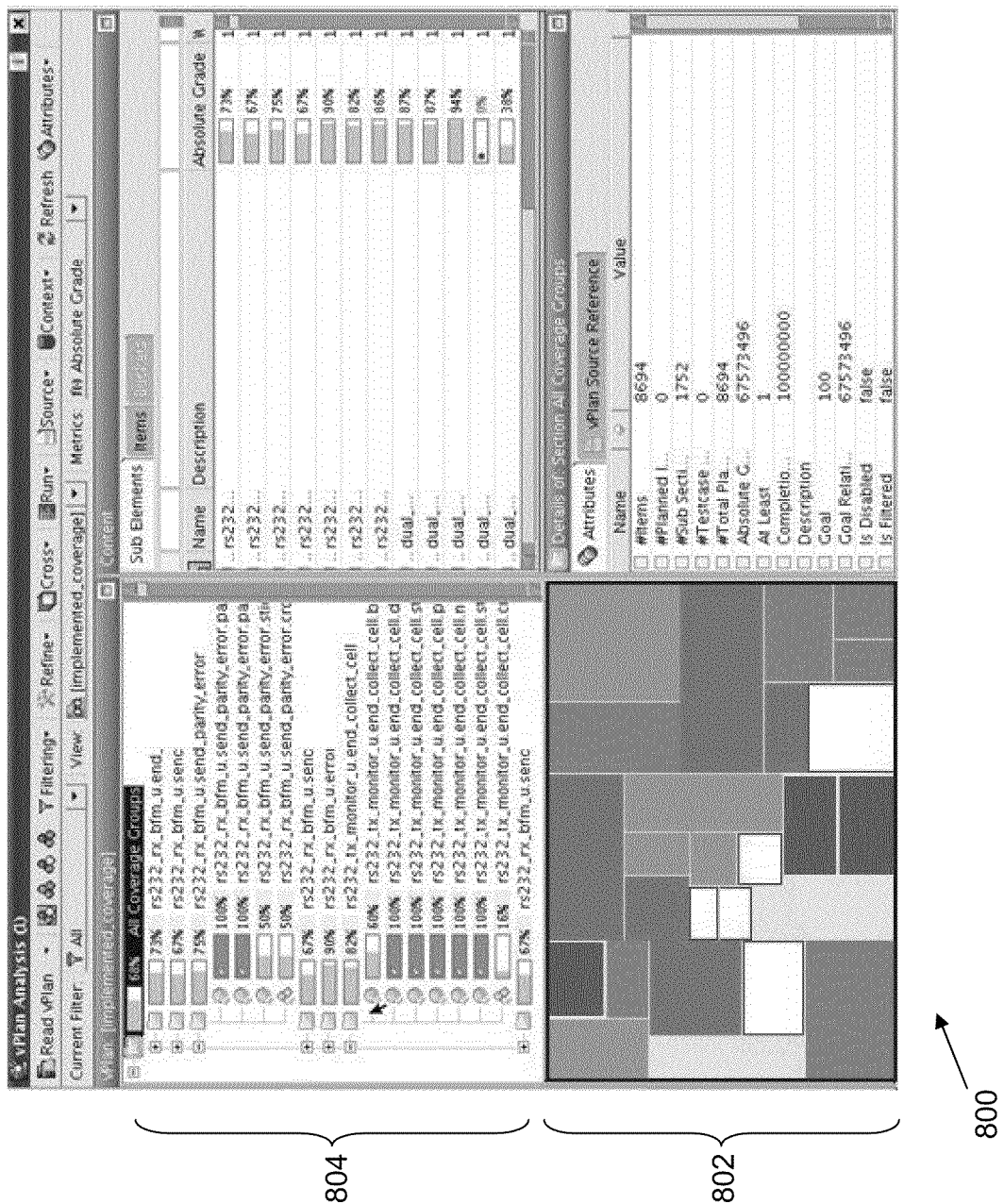
FIGS. 8-10 illustrate example user interfaces for graphically analyzing coverage according to some embodiments of the invention.

FIG. 8 provides an illustrative embodiment of a user interface 800 that shows a complete hierarchy on a single treemap 802. The comparable hierarchical representation is shown in the node and list representation of window 804.

The treemap 802 includes squarified rectangular portions that correspond to each node within the hierarchy. In this example, each of the rectangles of the treemap is associated with both a size attribute and a color/shading attribute. The size of a rectangle provides information about the coverage space of that node, where the size is directly proportional to the number of coverage points in that node.

The color and/or shading of the rectangle represent the percentage coverage of that node of the hierarchy. Effectively, the treemap element color/shading reflects the coverage (self or cumulative), by using a scale from bright to dark. For example, one way to color the rectangular boxes is as follows: 0% grade can be white, while 100% will be dark-green, and the range will be reflected by hues of green: from light (less coverage) to dark (more coverage).

Hierarchy browsing is straightforward in this approach since all the nodes of the hierarchy are displayed together in the treemap. Therefore, the treemap in this example shows the complete hierarchy is in a rectangular area with no white space wastage, which is advantageous as compared to the node-and-list representation. User can grasp the entire view without the need to scroll across multiple portions of the list.

The treemap structure will show related nodes (siblings) as adjacent elements in the treemap. This allows the user to analyze all child nodes of a given node easily. Details of the nodes can still be selected for display in the detail panes on the right-hand side of the user interface.

While analyzing the coverage result, it can be important to identify connections between the results of the different coverage elements. Such connection might imply or allow identification of a larger problem, and can also help the user's understanding the nature of the problem in a more efficient way. It may even assist in finding a wider solution that can solve a set of elements, rather than a single element.

This is where a tree-map view can be very helpful, when corresponding shades are shown in adjacent areas. The user can identify large problematic areas by doing a simple visual exploration of the tree map. For example, if some related elements (for example, siblings in the tree) have low coverage, it would show in the tree-map as a wide bright area. In other cases, a bright pattern where, for example, there are alternating elements of bright and dark, could also indicate a systematic problem, and be helpful in understanding the problem origin. This visual analysis is done by human very efficiently and can improve the overall effectiveness of the analysis process.

The graphical presentation of hierarchical coverage information using treemaps allows for quick browsing of hierarchies and fast identification of hierarchical nodes that contribute to low coverage. With respect to the quick browsing of the hierarchy, the treemap provides the user with a very efficient and fast approach to visualize the coverage data, with rectangular portions having sizes that correspond to the number of coverage points within each rectangle. With respect to the fast identification of hierarchical nodes which contribute low coverage, the coloration or shading of the rectangles permits very easy identification of nodes that correspond to areas of low coverage. This allows the user to direct future verification development and activities in a way that addresses the nodes that have problematic levels of coverage.

Of importance is that the treemap allows the user to gain greater focus into their analysis of the coverage space. To explain, consider that a first part of the hierarchical tree may have coverage of 2/100 (2 out of 100 coverage points), while a second part of the hierarchy may have coverage of 200/10000 (200 out of 10,000 coverage points). In both cases, the percentage of coverage is exactly the same (i.e., 2%), but their relative node sizes are dramatically different from one another. It is therefore important for the user to easily and efficiently be able to distinguish between these two portions of the tree, even though both are associated with the same coverage percentage. The present approach allows this to occur, since the rectangle in the treemap associated with the 100 coverage points is going to be much smaller than the rectangle in the treemap associated with the 10,000 coverage points, even though both rectangles will have the same coloration or shading to indicate the same coverage percentage. The coloring and shading of the rectangles allows the user to instantly identify which of the nodes should be subject to this type of review because of low coverage. This ability to instantly see in the graphics the distinction between the rectangles having more or less coverage points allows the user to easily visualize and focus on the portions that need to be addressed to improve verification coverage.

In an alternate approach, the treemap can be configured to show the hierarchy one level at a time in a single treemap. In this approach, the complete hierarchy is not shown in a rectangular space of a treemap, as in the previous approach. Instead, only the nodes at a certain level of hierarchy are shown on a rectangular treemap. The hierarchy is traversed by clicking on a particular node in a treemap, which will cause the display of the treemap of its child nodes at an immediate next level of hierarchy.

Figure 9:
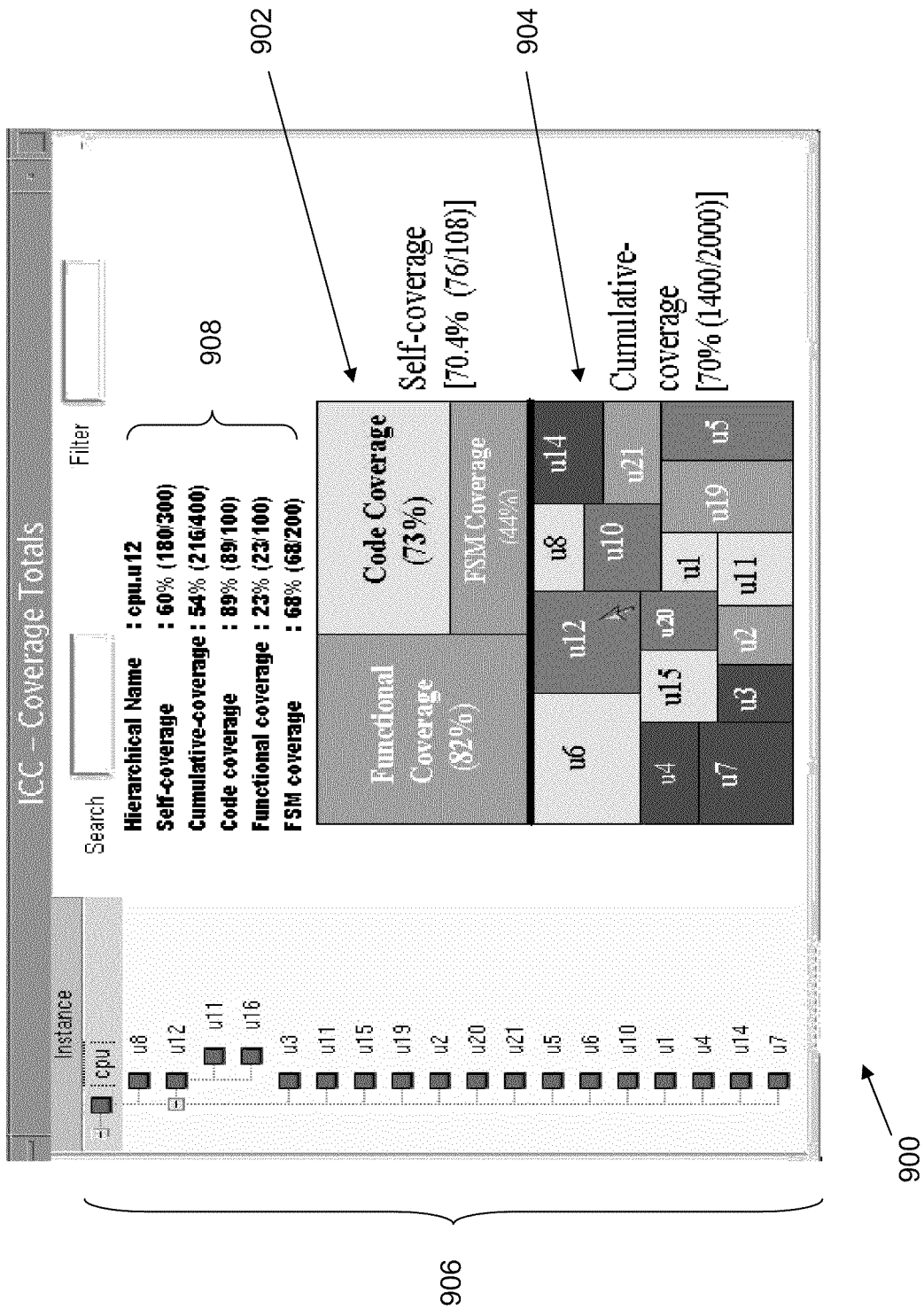
Figure 10:
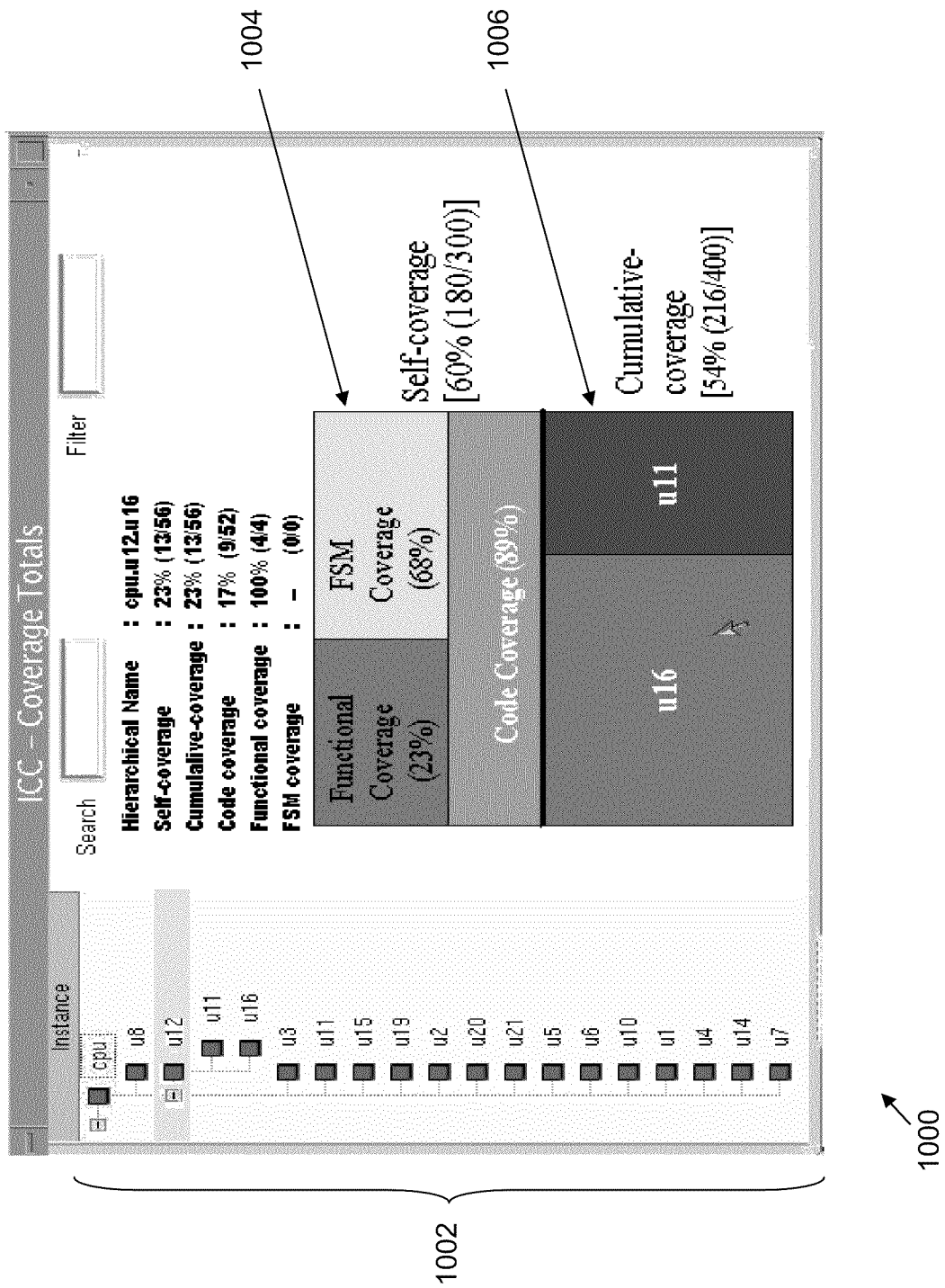

FIGS. 9 and 10 provide illustrative examples of this approach of showing the hierarchy one level at a time in a single treemap. As mentioned before, at any hierarchical level, a node has two parameters: self-coverage and cumulative-coverage. The two parameters are pictorially represented using treemaps through a rectangle partitioned into two sub-rectangles horizontally with a dark line dividing them.

In FIG. 9, the upper rectangle 902 displays information about self-coverage and the lower rectangle 904 represents cumulative-coverage for a specific node in the hierarchy tree 906. In this case, the treemap is displaying information about the "cpu" node from the hierarchy tree 906.

The self-coverage rectangle 902 is further divided depending on types of coverage enabled for the design. For example, three sub-rectangles are drawn in upper rectangle 902 corresponding to the three coverage types that are enabled for the node (e.g., code coverage, functional coverage, and FSM coverage). The size/color of each sub-rectangle is driven by the factors outlined in more detail below.

The cumulative-coverage rectangle 904 acts as the root node of the hierarchy below it. This root rectangle is further divided into "n" sub-rectangles where "n" is the number of child nodes of the root node at the immediate next lower level of hierarchy. Here, the root node is the "cpu" node from the hierarchy tree 906. The child nodes of the "cpu" node (e.g., u8, u12, u3, etc.) are represented as sub-rectangles within rectangle 904.

The size of each rectangle is proportional to the number of coverage points in that node. Therefore, a node having more coverage points will correspond to a larger sized rectangle as compared to a node having less coverage points. For example, the rectangle for sub-node u6 is larger than the rectangle for sub-node u4. This difference in rectangle size allows the user to instantly appreciate and understand that u6 has more coverage points compared to u4.

The color of the rectangle is governed by the coverage. For example, the color can vary from Red to Yellow to Green as the coverage increases. A big red rectangle in the treemap signifies that a node with large number of cover-points is uncovered. This catches user's attention immediately. According to some embodiments, shading can be in conjunction with the colors to provide even finer granularity for the indication of the level of coverage for a node.

Placing the mouse pointer at a specific node indicates to the user interface that additional information is to be displayed about that node. For example, the mouse pointer in FIG. 9 is presently hovering over the rectangle for node u12. Portion 908 of the user interface displays the detailed coverage information about the selected node u12.

For hierarchical browsing, if a sub-rectangle (e.g., child, u12 in FIG. 9) in the cumulative-coverage rectangle is selected or "clicked", a fresh rectangle with self/cumulative-coverage of u12 appears, e.g., as displayed in FIG. 10. Correspondingly, the node u12 in the hierarchical tree 1002 on the left is highlighted as shown in FIG. 10.

The upper rectangle 1004 of the treemap shows the self-coverage figures of node u12. As previously noted, the self-coverage rectangle 1004 can be sub-divided depending on types of coverage enabled for the design. For example, three sub-rectangles are drawn in upper rectangle 1004 corresponding to the code, functional, and FSM coverage types that are enabled for the node.

For lower cumulative-coverage rectangle 1006, u12 serves as the root rectangle and is further partitioned into sub-rectangles for the child nodes of u12. Here, sub-nodes u16 and u11 are the children of u12 and therefore each sub-node corresponds to a sub-rectangle within cumulative-coverage rectangle 1006.

This process of browsing the hierarchy can continue all the way down to a leaf level node. In the case of leaf instance(s), the cumulative-coverage rectangle shows the percentage figures which will be same as self-coverage, without any partitioning into sub-rectangles.

The approach of FIG. 8 and the approach of FIGS. 9-10 are two examples of EDA applications serving two different use models. These two approaches differ from each other with respect to the layout of rectangles in the treemap. When the complete hierarchy is shown as a single treemap, then it becomes important to preserve the order of the nodes of hierarchy. Hence emphasis is paid on the order preservation and not the layout of rectangles. This may result in low resolution because of occurrence of thin elongated rectangles. On the other hand, when the hierarchy at one particular level is shown at a time in a single treemap, then effort is made to achieve squarification as much as possible while preserving order to a large extent. Squarification helps in keeping the resolution within limits while letting user to do comparative analysis easily.

In addition, different approaches can (also not necessarily) differ in their usage of color schemes for the rectangles. The color scheme can be implemented with rectangles having different shades of green, where as the percentage coverage of a rectangle increases, the color green becomes darker. In the other approach, there are different colors for the different rectangles, e.g., red, yellow and green. For low or 0% coverage, the rectangle is colored in red. For intermediate percentage coverage it is yellow and for high coverage percentage, the coloring is done in green.

Both the coloring schemes have their advantages and disadvantages. Using shades of green makes it a little difficult for human eye to perceive the whole picture in one glance. This is because this is a case of relative judgment where the interpretation of the color of a rectangle will happen only by comparing it with its neighboring rectangle. However, it allows analysis to be performed even using monochromatic displays and prints. Additionally, various shades of green give more accurate picture of the percentages, whereas in the other approach a single color signifies a complete range of percentages. On the other hand, three different colors enable the user to do absolute judgment without the need of any comparisons.

An application may choose to implement other possible combinations of rectangle layouts and coloring schemes. For example, an application can use shades of green with squarified rectangles shown at one level of hierarchy, and another EDA application can use multiple colored rectangles with complete hierarchy shown as a single treemap.

In addition to above basic infrastructure of treemaps to perform graphical analysis of coverage using a hierarchy, a graphical analysis tool can have additional features to facilitate the visualization of treemaps. These additional features apply to either of the two approaches of using treemaps mentioned in previous sections.

For searching, a search text box right atop the treemaps can be used for the user to specify the node to be searched. As soon as the user presses 'Search' button after giving an entry in the text-box, that node is searched in the hierarchy tree on the left and is highlighted, if found, with its corresponding treemap displayed in the right frame of the window.

For filtering, just like "Search" text box, there can be a "Filter" text box, to filter the displayed nodes. If more than one node matches the filtering criteria, then all those nodes are highlighted, but the context of the treemap is on the first such node in the tree, i.e. the corresponding treemap of only that (first) node is displayed in the right frame. The main difference between searching and filtering is that, search performs exact match between the specified string and the node names and can result in at most one match, while filter can match specified regular expressions with node names and can result in multiple matches.

For information display using tool-tip (e.g., mouse over), moving the cursor over a rectangle in the cumulative-coverage area of a treemap produces information on hierarchical name, self-coverage and cumulative-coverage (all types) on the top of the display. As shown in FIG. 9, the mouse cursor is over instance u12. As a result, the complete information of u12, comprising the full hierarchical name, self-coverage, and cumulative-coverage for all types of coverages is displayed just above the treemap.

Similarly in FIG. 10, the mouse cursor is over u16, for which the complete information is displayed. This feature enables user to have apriori information of the coverage of that node without the need to click it. This facilitates the detection of the nodes, which are contributing to low self-coverage, in turn expediting the overall coverage analysis.

Another useful features can be zoom-in and zoom-out of the various sections of the treemaps. In order to explore the search tree, the user of the treemap visualization tool can zoom in and out, or resize the window. This is particularly helpful for the cases when there are many nodes on the same level of hierarchy, which may result in some rectangle(s) with extremely less area and are difficult to view without zoom-in capability.

The algorithm employed for the construction of treemap should be such that it results in an efficient layout of the rectangles. The presentation of all nodes and leaves as more square-like rectangles has several advantages. Square items are easier to detect and point at. Additionally, comparison of the size of rectangles is easier when their aspect ratios are similar. There is one basic idea to create such squarification which tessellates a rectangle recursively into rectangles, such that their aspect-ratios (e.g. max(height=width; width=height)) approach 1 as close as possible.

At the same time, it is important in some embodiments to preserve the order of elements of hierarchy. The ordering is preserved using ordered treemaps. Ordered treemap layout algorithms ensure that sibling nodes in the hierarchy are near each other in the treemap layout. Among the ordered treemap layout algorithms, the split treemap layout algorithm has the best average aspect ratio. For the coverage analysis application of treemaps, the split layout algorithm is the best suited.

As mentioned before a treemap does not necessarily need to replace the tree browser. Instead, it has qualities can be combined and used in conjunction with existing tree browsers. This synergy combination creates a powerful analysis tool, with unique capabilities.

Therefore, what has been described is an improved approach for performing verification coverage analysis. The present approach allows a user to significantly hasten his/her grasp of complete information about the test coverage. As previously noted, the human vision is gifted with the ability to recognize spatial arrangement of various elements in a picture and identify their relationships. The treemap visualization method presents hierarchical information on a 2-D display space, such that the 100% allocated space is consumed. Specifically for coverage analysis, this makes it convenient for a user to gather the overall picture of the coverage.

Moreover treemaps can also be configured to adjust the size of each sub-area depending on additional information located at the nodes. The color intensity of each treemap rectangle can be used to attach more attributes to each node. This greatly enhances the visualization advantages of the treemap for coverage analysis.

In addition, the present approach helps the user to quickly understand the relationship between hierarchy elements. By using ordered treemaps and the disclosed browsing features, the user is able to associate parent-child relationship between the nodes. For the purpose of coverage analysis, the user can compare parameters like size and color to identify holes, in order to eventually increase the coverage. The user can find out how coverage is spread over the hierarchy and identify the nodes with lowest coverage.

System Architecture Overview

Figure 12:
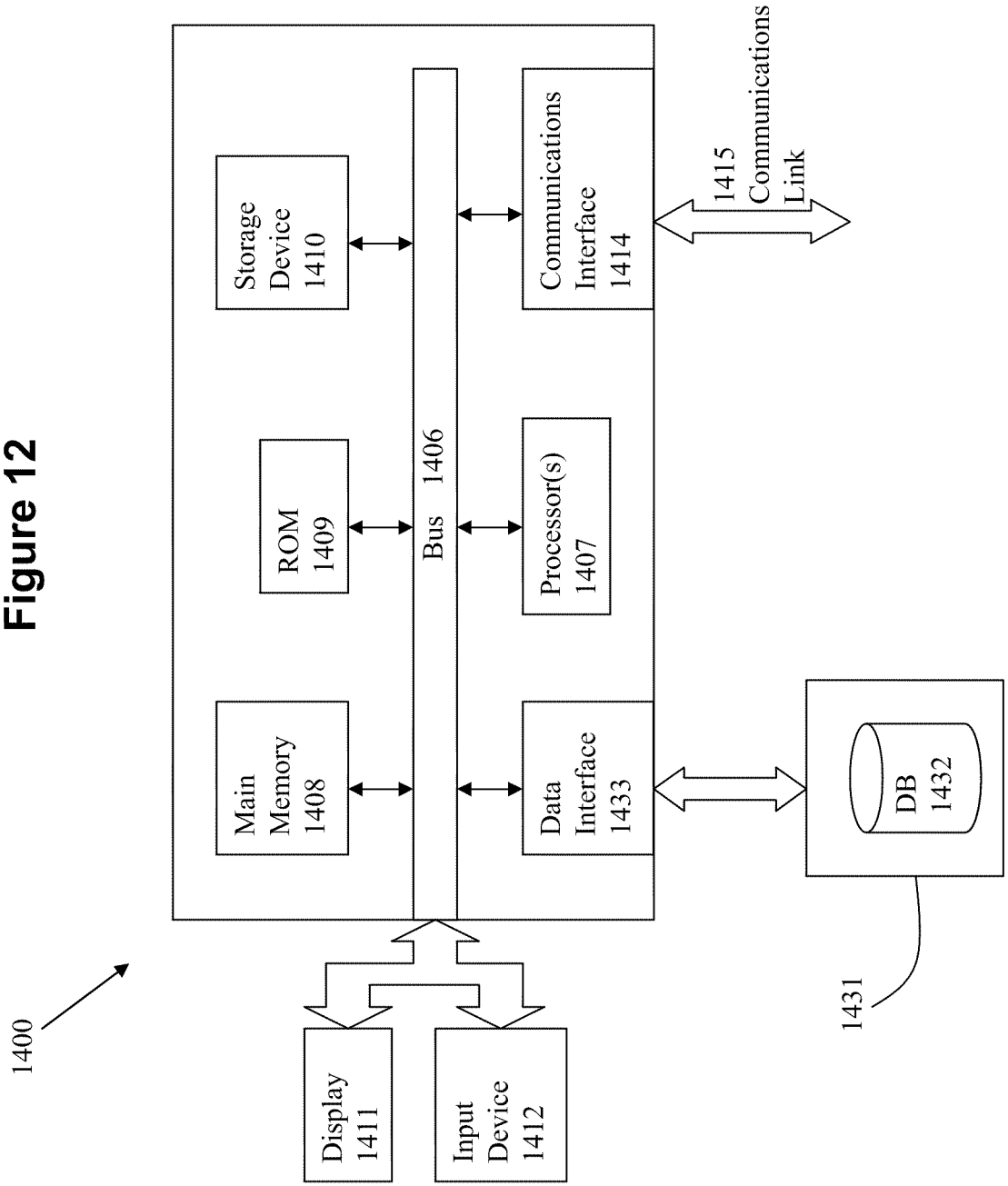
FIG. 12 shows an architecture of an example computing system with which the invention may be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer program product that includes a non-transitory computer readable storage medium, the non-transitory computer readable storage medium comprising a plurality of computer instructions which, when executed by at least one processor, cause the processor to execute a method for displaying coverage information for verification, the method comprising:

using at least one process that is at least to perform a process, the process comprising:

generating a treemap to display coverage information for a verification activity for a hierarchical electronic circuit design having a plurality of nodes, wherein generating the treemap to display the coverage information comprises:

generating the treemap based at least in part upon whether the tree map includes a complete hierarchy or a single hierarchical level by using at least a priority that is determined between preservation of an order of the plurality of nodes and improvement of an aspect for at least a part of the treemap, in which the treemap comprises a display portion having a size, the size of the display portion indicates a respective physical size of a corresponding portion of the hierarchical electronic circuit design, and the display portion corresponds to a node on a tree structure having nodes and links of the hierarchical electronic circuit design; and verifying or designing the hierarchical electronic circuit design based at least in part upon the treemap.

2. The computer program product of claim 1, in which
the treemap provides a representation of data from a hierarchical tree structure, and
a node in the hierarchical tree structure is represented as a rectangular portion of the treemap.

3. The computer program product of claim 1, in which
the treemap comprises rectangular portions having a size that corresponds to a relative size of a parameter.

4. The computer program product of claim 3, in which
the parameter comprise a number of coverage points for the verification activity, and
a larger rectangle corresponds to a greater number of coverage points.

5. The computer program product of claim 1 in which the treemap comprises a color or shading for a region that is representative of a percentage of coverage indicating a ratio between a number of nodes covered in the region and a total number of nodes in one or more hierarchical levels of the hierarchical electronic circuit design.

6. The computer program product of claim 1, in which the treemap comprises a combination of or a single type of a squarified treemap, slice and dice treemap, or a cushion treemap.

7. The computer program product of claim 1, in which the treemap shows a complete hierarchy or a single hierarchical level.

8. The computer program product of claim 7, in which related nodes are adjacent in the treemap.

9. The computer program product of claim 1, the action of generating the treemap comprising:
determining whether the treemap includes a complete hierarchy or only a single hierarchical level of the hierarchical electronic circuit design;
determining a priority between an action of preserving an order of a plurality of nodes in the hierarchical electronic circuit design and an action of improving width-to-length ratio for the treemap; and
generating the treemap based at least in part upon the priority.

10. The computer program product of claim 9, in which a hierarchy is traversed by selecting a node for which the treemap is to be displayed, and the process further comprises:

determining a processing order in which a plurality of regions in the treemap is processed; and
optimizing the treemap based at least in part upon an aspect ratio of each of the plurality of regions in the treemap.

11. The computer program product of claim 9, in which
a first treemap shows self-coverage information and second treemap shows cumulative coverage information.

12. The computer program product of claim 1, in which
different rectangular portions of the treemap correspond to different coverage types or different sub-nodes.

13. The computer program product of claim 10, in which
the processing order comprises an order of decreasing size of the plurality of regions in the treemap.

14. The computer program product of claim 1, in which the action of generating the tree map comprises:
adding a first region to the treemap by dividing a total area of the treemap into the first region and a remaining region based at least in part upon a criterion;
adding the second region to the treemap by dividing the remaining area of the treemap into the second region and a remainder based at least in part upon the criterion;
determining whether the second region improves an attribute of the treemap, in which the attribute comprises a maximum aspect ratio of one or more regions in the treemap; and
finalizing the second region in the treemap based at least in part upon a result of determining whether the second region improves the attribute of the treemap.

15. The computer program product of claim 11, in which
the self-coverage information corresponds to a first ratio between a number of covered items in an instance or a module of the hierarchical electronic circuit design and a total number of items in the instance or the module, and
the cumulative coverage information corresponds to a second ratio between the total number of items in the instance or the module and a sum of the number of covered items in the instance of the module and a first number of covered items in all child instances or child modules of the instance or the module.

16. A computer implemented method for displaying coverage information for verification, comprising:
using at least one process that is to perform a process, the process comprising:
generating a treemap to display coverage information for a verification activity for a hierarchical electronic circuit design having a plurality of nodes, wherein generating the treemap to display the coverage information comprises:
generating the treemap based at least in part upon whether the tree map includes a complete hierarchy or a single hierarchical level by using at least a priority that is determined between preservation of an order of the plurality of nodes and improvement of an aspect for at least a part of the treemap, in which the treemap comprises a display portion having a size, the size of the display portion indicates a respective physical size of a corresponding portion of the hierarchical electronic circuit design, and the display portion corresponds to a node on a tree structure having nodes and links of the hierarchical electronic circuit design; and
verifying or designing the hierarchical electronic circuit design based at least in part upon the treemap.

17. The computer implemented method of claim 16, in which
the treemap provides a representation of data from a hierarchical tree structure, and a node in the hierarchical tree structure is represented as a rectangular portion of the treemap.

18. The computer implemented method of claim 16, in which
the treemap comprises rectangular portions having a size that corresponds to a relative size of a parameter, and
the parameter comprise a number of coverage points for the verification activity, wherein a larger rectangle corresponds to a greater number of coverage points.

19. The computer implemented method of claim 18, in which
the parameter comprise a number of coverage points for the verification activity, and
a larger rectangle corresponds to a greater number of coverage points.

20. The computer implemented method of claim 16, in which the treemap comprises a color or shading for a region that is representative of a percentage of coverage indicating a ratio between a number of nodes covered in the region and a total number of nodes in one or more hierarchical levels of the hierarchical electronic circuit design.

21. The computer implemented method of claim 16, in which the treemap comprises a combination of or a single type of a squarified treemap, slice and dice treemap, or a cushion treemap.

22. The computer implemented method of claim 16, in which the treemap shows a complete hierarchy or a single hierarchical level.

23. The computer implemented method of claim 22, in which related nodes are adjacent in the treemap.

24. The computer implemented method of claim 16, the action of generating the treemap comprising:
determining whether the treemap includes a complete hierarchy or only a single hierarchical level of the hierarchical electronic circuit design;
determining a priority between an action of preserving an order of a plurality of nodes in the hierarchical electronic circuit design and an action of improving width-to-length ratio for the treemap; and
generating the treemap based at least in part upon the priority.

25. The computer implemented method of claim 24, in which a hierarchy is traversed by selecting a node for which the treemap is to be displayed, and the process further comprises:
determining a processing order in which a plurality of regions in the treemap is processed; and
optimizing the treemap based at least in part upon an aspect ratio of each of the plurality of regions in the treemap.

26. The computer implemented method of claim 24, in which
a first treemap shows self-coverage information and second treemap shows cumulative coverage information.

27. The computer implemented method of claim 16 in which different rectangular portions of the treemap correspond to different coverage types or different sub-nodes.

28. The computer implemented method of claim 25, in which the processing order comprises an order of decreasing size of the plurality of regions in the treemap.

29. The computer implemented method of claim 16, in which the action of generating the treemap further comprises:
adding a first region to the treemap by dividing a total area of the treemap into the first region and a remaining region based at least in part upon a criterion;
adding the second region to the treemap by dividing the remaining area of the treemap into the second region and a remainder based at least in part upon the criterion;
determining whether the second region improves an attribute of the treemap, in which the attribute comprises a maximum aspect ratio of one or more regions in the treemap; and
finalizing the second region in the treemap based at least in part upon a result of determining whether the second region improves the attribute of the treemap.

30. The computer implemented method of claim 26, in which
the self-coverage information corresponds to a first ratio between a number of covered items in an instance or a module of the hierarchical electronic circuit design and a total number of items in the instance or the module, and
the cumulative coverage information corresponds to a second ratio between the total number of items in the instance or the module and a sum of the number of covered items in the instance of the module and a first number of covered items in all child instances or child modules of the instance or the module.

31. A system for displaying coverage information for verification, comprising:
at least one processor that is at least to:
generate a treemap to display coverage information for a verification activity for a hierarchical electronic circuit design having a plurality of nodes, wherein the at least one processor that is to generate the treemap to display the coverage information is further to:
generate the treemap based at least in part upon whether the tree map includes a complete hierarchy or a single hierarchical level by using at least a priority that is determined between preservation of an order of the plurality of nodes and improvement of an aspect for at least a part of the treemap, in which the treemap comprises a display portion having a size, the size of the display portion indicates a respective physical size of a corresponding portion of the hierarchical electronic circuit design, and the display portion corresponds to a node on a tree structure having nodes and links of the hierarchical electronic circuit design; and
verify or design the hierarchical electronic circuit design based at least in part upon the tree map.

32. The system of claim 31, in which
the treemap provides a representation of data from a hierarchical tree structure, and
a node in the hierarchical tree structure is represented as a rectangular portion of the treemap.

33. The system of claim 31, in which
the treemap comprises rectangular portions having a size that corresponds to a relative size of a parameter, and
the parameter comprise a number of coverage points for the verification activity, wherein a larger rectangle corresponds to a greater number of coverage points.

34. The system of claim 33, in which
the parameter comprise a number of coverage points for the verification activity, and
a larger rectangle corresponds to a greater number of coverage points.

35. The system of claim 31, in which the treemap comprises a color or shading for a region that is representative of a percentage of coverage indicating a ratio between a number of nodes covered in the region and a total number of nodes in one or more hierarchical levels of the hierarchical electronic circuit design.

36. The system of claim 31, in which the treemap comprises a combination of or a single type of a squarified treemap, slice and dice treemap, or a cushion treemap.

37. The system of claim 31, in which the treemap shows a complete hierarchy or a single hierarchical level.

38. The system of claim 37, in which related nodes are adjacent in the treemap.

39. The system of claim 31, the at least one processor to generate the treemap is further to:
- determine whether the treemap includes a complete hierarchy or only a single hierarchical level of the hierarchical electronic circuit design;
- determine a priority between an action of preserving an order of a plurality of nodes in the hierarchical electronic circuit design and an action of improving width-to-length ratio for the treemap; and
- generate the treemap based at least in part upon the priority.

40. The system of claim 39, in which a hierarchy is traversed by selecting a node for which the treemap is to be displayed, and the at least one processor is further to:
- determine a processing order in which a plurality of regions in the treemap is processed; and
- improve the treemap based at least in part upon an aspect ratio of each of the plurality of regions in the treemap.

41. The system of claim 39, in which
- a first treemap shows self-coverage information and second treemap shows cumulative coverage information.

42. The system of claim 31, in which different rectangular portions of the treemap correspond to different coverage types or different sub-nodes.

43. The system of claim 31, in which the processing order comprises an order of decreasing size of the plurality of regions in the treemap.

44. The system of claim 31, in which the at least one processor to generate the treemap is further to:
- add a first region to the treemap by dividing a total area of the treemap into the first region and a remaining region based at least in part upon a criterion;
- add the second region to the treemap by dividing the remaining area of the treemap into the second region and a remainder based at least in part upon the criterion;
- determine whether the second region improves an attribute of the treemap, in which the attribute comprises a maximum aspect ratio of one or more regions in the treemap; and
- finalize the second region in the treemap based at least in part upon a result of determining whether the second region improves the attribute of the treemap.

45. The system of claim 41, in which the self-coverage information corresponds to a first ratio between a number of covered items in an instance or a module of the hierarchical electronic circuit design and a total number of items in the instance or the module, and the cumulative coverage information corresponds to a second ratio between the total number of items in the instance or the module and a sum of the number of covered items in the instance of the module and a first number of covered items in all child instances or child modules of the instance or the module.

\* \* \* \* \*